United States Patent [19]
Tsay et al.

[11] Patent Number: 6,150,968
[45] Date of Patent: Nov. 21, 2000

[54] TRIMMING CIRCUITRY FOR PIPELINE A/D CONVERTER

[75] Inventors: Ching-yuh Tsay; Eric G. Soenen, both of Plano, Tex.

[73] Assignee: Texas Instruments Incorporated, Dallas, Tex.

[21] Appl. No.: 09/188,960

[22] Filed: Nov. 10, 1998

Related U.S. Application Data

[60] Provisional application No. 60/067,262, Dec. 2, 1997.

[51] Int. Cl.[7] ....................................................... H03M 1/62
[52] U.S. Cl. ........................... 341/139; 341/150; 341/172
[58] Field of Search ..................................... 341/139, 143, 341/172, 120, 150, 161, 118

[56] References Cited

U.S. PATENT DOCUMENTS

| | | | |
|---|---|---|---|
| 4,200,863 | 4/1980 | Hodges et al. | 341/172 |
| 5,581,252 | 12/1996 | Thomas | 341/172 |
| 5,600,322 | 2/1997 | Garavan | 341/172 |
| 5,852,415 | 12/1998 | Cotter et al. | 341/120 |
| 6,031,480 | 2/2000 | Soenen et al. | 341/161 |

*Primary Examiner*—Howard L. Williams
*Assistant Examiner*—Jean B. Jeanglaude
*Attorney, Agent, or Firm*—Alan K. Stewart; Wade James Brady, III; Frederick J. Telecky, Jr.

[57] ABSTRACT

A trimming circuit for a gain stage in a pipeline analog-to-digital converter includes an amplification stage (30) having associated therewith on one input thereof a coupling capacitor (38). In parallel with the coupling capacitor is provided a trimming network. The trimming network includes a series configuration of a coupling capacitor and a plurality of trimming capacitors, which trimming capacitors can be disposed in parallel with each other. Each of the trimming capacitors has associated therewith a switch which allows them to be selectively disposed in series with a coupling capacitor (42) and in parallel with each other. This trimming network is connected in parallel with the sampling capacitor (38). The input to the amplifier is isolated from the trimming network with a buffer (62) which is operable to isolate the impedance of the trimming capacitors from the input and from preceding stages.

12 Claims, 4 Drawing Sheets

TRIMMING CIRCUITRY FOR PIPELINE A/D CONVERTER

CROSS-REFERENCE TO RELATED APPLICATIONS

This application claims priority under 35 USC § 119 (e) (1) of provisional application No. 60/067,262, filed Dec. 2, 1997.

This Application is related to U.S. patent application Ser. No. 60/031,347, filed Nov. 19, 1996, and entitled "Method and Apparatus for Implementing a Pipeline A/D Converter with Interstage Amplifiers Having No Common-Mode Feedback Circuitry," and related to copending U.S. patent application Ser. No. 09/190,474, entitled "Trimming Algorithm for Pipeline Analog-to-Digital Converter".

TECHNICAL FIELD OF THE INVENTION

The present invention pertains in general to A/D converters and, more particularly, to trimming circuitry for trimming the amplifier stage in a pipeline A/D converter.

BACKGROUND OF THE INVENTION

Data conversion devices of the type utilizing analog-to-digital converters are utilized primarily for the purpose of quantizing analog signals for use in digital signal processing thereof. As the need for more powerful digital signal processing systems increases, the need for higher resolution ADCs increases. However, this increase in resolution also requires the ADCs to provide a much higher level of accuracy.

Most ADCs utilize switched capacitor elements and differential amplifiers. These switched capacitor elements, in order to obtain the necessary accuracy, must be accurately matched. Of course, this then requires the manufacturing process to achieve high levels of accuracy, which are sometimes difficult due to matching limitations between components, which components are fundamentally related to each other in an ADC algorithm by ratios therebetween. Since these limitations usually exceed the process capabilities, various calibration techniques are then implemented.

One type of ADC that has overcome some of the disadvantages noted above is the pipelined analog-to-digital converter. This type of ADC has some advantages over the flash or successive approximation techniques due to potentially high resolution and high speed that can be achieved at the same time. These converters use a plurality of converter stages, each converter stage involving a sub-ADC and a reconstructing digital-to-analog (DAC) converter. In addition, there is a gain element associated with each converter stage in the analog domain. The data conversion techniques utilize a plurality of switched capacitor elements, the output of which is an analog signal that is typically input to a differential interstage amplifier stage to provide the gain element. The implementation of the interstage amplifier utilizing a fully differential amplifier yields superior performance in power supply rejection. However, this is achieved with an interstage amplifier that utilizes common-mode feedback circuitry. This circuitry typically increases area, power and complexity, in addition to introducing parasitics, with a noted decrease in stability and speed.

In the design of accurate pipeline analog-to-digital converters, the gain of each stage is probably the most critical parameter. Other factors aside, the major contributor to gain error is capacitor mismatch. To account for mismatch, techniques have been developed to "trim" capacitors. This, of course, is difficult in that either capacitors must be added or subtracted from a circuit to place them in parallel order or remove them therefrom.

SUMMARY OF THE INVENTION

The present invention disclosed and claimed therein comprises an input gain stage for amplifying an input signal on a signal input. The gain stage includes an amplifier having an input and an output, and an input capacitor having one plate thereof connected to the signal input and the other plate thereof connected to the input of the amplifier. A feedback capacitor is provided with one plate thereof connected to the input of the amplifier and the other plate thereof connected to the output of the amplifier. A variable trimming capacitance network having a first side and a second side is disposed between the input of the amplifier and a first node. The first node is connected to the output of a buffer, the buffer isolating the capacitance network from the input signal wherein the input of the buffer is connected to the signal input. This isolation allows the trimming capacitance network to be isolated from any preceding gain stages that may be attached thereto. The combination of the buffer and the trimming capacitance network define a parallel capacitance which is disposed in parallel with the input capacitance such that the combination of the input capacitor, the trimming capacitance network and the buffer constitute an effective input capacitance. The ratio of the effective input capacitance to the feedback capacitor defines the gain of the amplifier.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
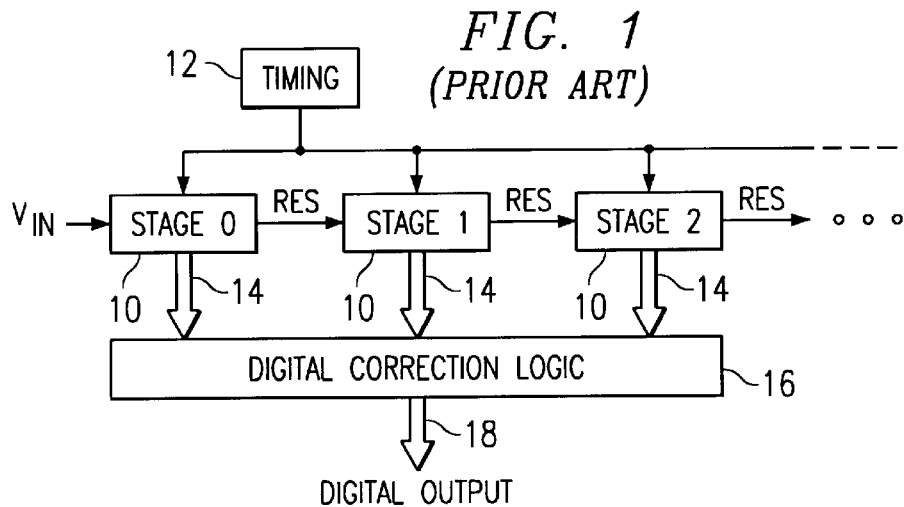
FIG. 1 illustrates a block diagram of a pipelined analog-to-digital converter.

Referring now to FIG. 1, there is illustrated a block diagram of a data conversion device utilizing a pipelined architecture. This pipelined architecture utilizes a plurality of multiply-by-two converter stages 10, arranged in a pipelined configuration, with the first of the stages 10 receiving an analog input voltage $V_{in}$ and outputting a residue analog signal. However, the gain could be a value different from two, but must be greater than one. The residue of each converter stage 10 after stage zero receives on the input thereof the residue analog signal from the previous converter stage 10. Each of the converter stages 10 receives timing signals from a timing block 12. Each of the converter stages 10 also outputs a 2-bit digital output, often referred to as a local output, on a 2-bit bus 14. Each of the buses 14 is input to a digital correction logic block 16 to provide a digital output on a bus 18, the digital output representing the conversion result of the data conversion device. The operation of the pipelined architecture is generally described in E. G. Soenen and R. L. Geiger, "An Architecture and An Algorithm for Fully Digital Correction of Monolithic Pipelined ADC's," IEEE Transactions On Circuits and Systems, vol. 42, No. 3, March 1995, pages 143–153, which article is incorporated herein by reference. Additionally, the operation of the pipelined ADC is also described in U.S. Pat. No. 5,499,027, issued to A. N. Karanicolas et al., on Mar. 12, 1996, which patent is incorporated herein by reference.

Figure 2:
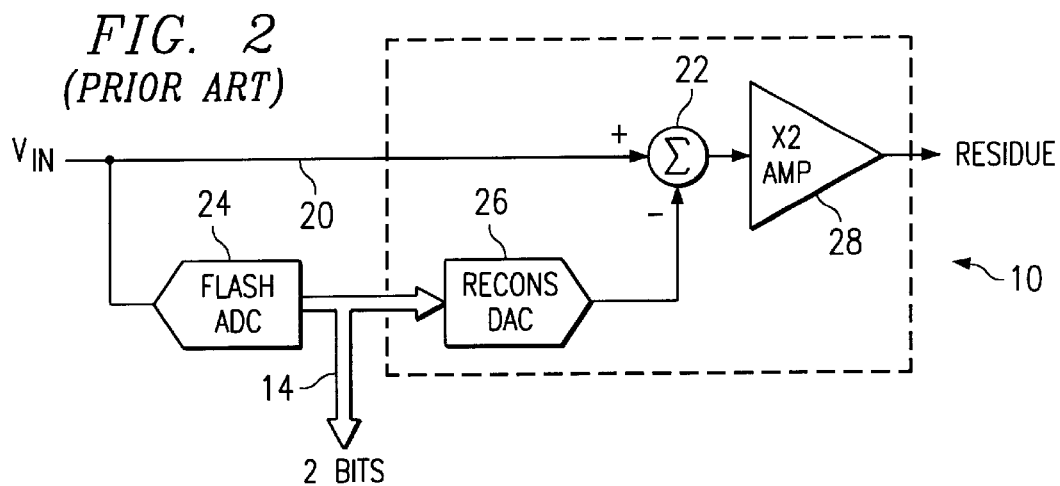
FIG. 2 illustrates a block diagram of one stage of the pipelined architecture.

Referring now to FIG. 2, there is illustrated a more detailed logic diagram of each of the converter stages 10. The input signal is received on a node 20, which node 20 is input to the positive input of a summing junction 22. The input voltage on node 20 is also input to the input of a flash ADC 24, the output thereof comprising the 2-bit output on the bus 14. This digital value then becomes an input to a reconstruction DAC 26, the digital output thereof comprising an input to the negative input of the summing junction 22. The summing junction output from summing junction 22 comprises the input to an interstage amplifier 28, the output of which comprises the residue signal. Although not illustrated as such, it should be understood that the input signal on node 20 is a differential voltage and the amplifier 28 is a differential amplifier.

In operation, the input signal is compared against a number of reference levels, $V_{ref}$, with the flash ADC 24 to provide a rough digital representation of the input voltage on the bus 14. This is sometimes referred to as a "thermometer format." This in general is referred to as the "local code" for the particular converter stage 10. This rough approximation is then converted to an analog value and subtracted from the analog input signal for that converter stage 10, and then multiplied by a factor of two by amplifier 28 before input to the next converter stage 10. The local codes in the present embodiment is a two bit value. The digital correction block 16 is operable to take the weighted sum of these local codes to generate the output in the following manner:

$$D_{OUT} = V_{DAC}^1 + \frac{V_{DAC}^2}{A_1} + \frac{V_{DAC}^3}{A_1 A_2} + \dots$$

where:

$A_1, A_2, \dots$ is the gain of the successive stages $V_{DAC}$ is the output of the reconstructing DAC With the two bit local code, the digital correction block 16 will sum the adjacent bits of the local code of adjacent stages and provide a binary output therefore, with the LSB bit of the last stage being the LSB of the output and the MSB of the output being the sum of the MSB of the first stage and possible carry bits generated by the summation.

Figure 3:
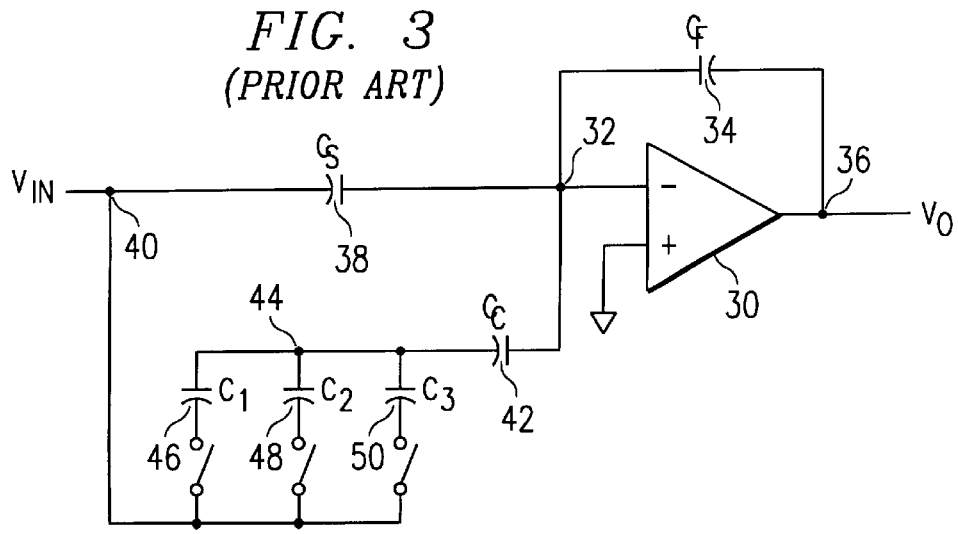
FIG. 3 illustrates a circuit diagram of a prior art amplifier stage with trimmed capacitors.

Referring now to FIG. 3, there is illustrated a schematic diagram of a prior art gain stage. An amplifier 30 is provided having a positive and a negative input, the positive input thereof connected to ground and the negative input thereof connected to the node 32. A feedback capacitor 34 is connected between the node 32 and an output node 36 of the amplifier 30. A sampling capacitor 38, labeled $C_s$, is connected between node 32 and an input node 40. A coupling capacitor 42 has one plate thereof connected to node 32 and one plate thereof connected to a node 44, coupling capacitor 42 labeled $C_c$. Between node 44 and node 40 there are connected three coupling capacitors 46, 48 and 50, labeled $C_1$, $C_2$ and $C_3$. The coupling capacitors 46–50 are each switchable with associated switches for selective connection between node 44 and node 40 such that the total sampling capacitance, $C'_s$, is as large as:

$$C'_s = C_s + (C_c \| (C_1 + C_2 + C_3)) \qquad (2)$$

The close-loop gain of the stage is:

$$\text{Gain} = A = \frac{C'_s}{C_f} \qquad (3)$$

By turning on/off the switches associated with the capacitors 46–50, the gain A of the stage can be trimmed.

The purpose of utilizing the series connected coupling capacitor 42, $C_c$, is to reduce the "weight" of trimming capacitors $C_1$, $C_2$ and $C_3$, capacitors 46–50. Without the use of the coupling capacitor 42, the values of the trimming capacitors will be too small to be manufactured effectively. The disadvantage of the prior art circuit of FIG. 3 is that the input capacitance as seen by the previous stage at the node 40 is greatly increased due to the presence of the capacitors 46–50 and the parasitic capacitances of their switches. This increase of input capacitance could possibly load down prior stages and could eventually limit the speed performance of the overall converter.

Figure 4:
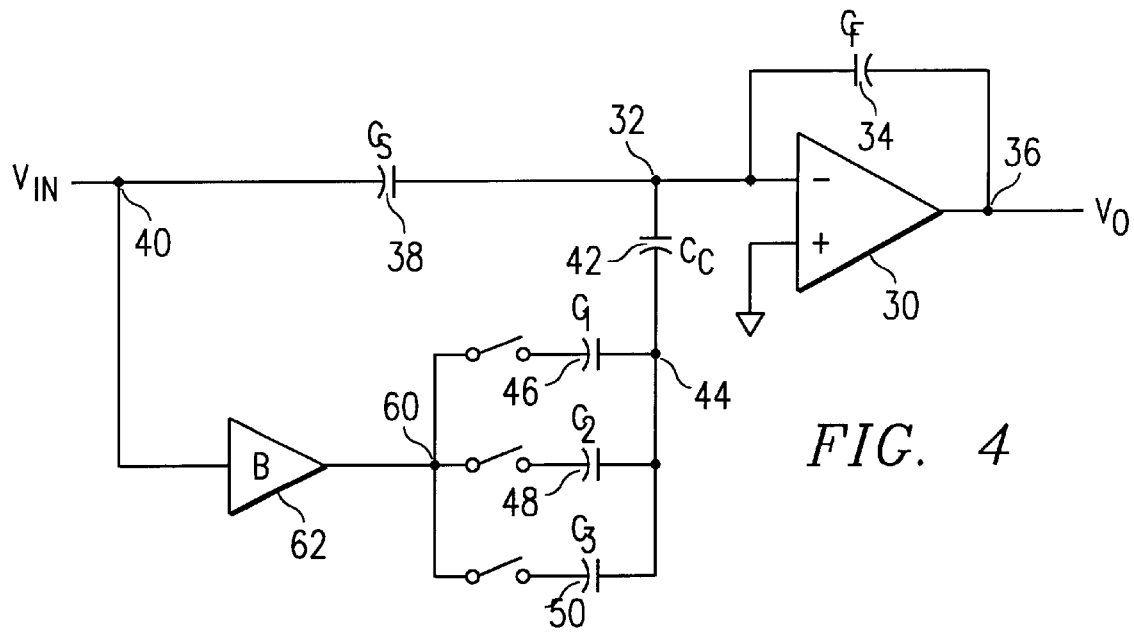
FIG. 4 illustrates a schematic diagram of the trimming method of the present invention.

Referring now to FIG. 4, there is illustrated an input stage operating in accordance with the present invention, wherein like numerals refer to like parts in the two figures. However, the capacitors 46–50 are connected between the node 44 and a node 60, rather than directly to node 40. A buffer circuit 62 is disposed between node 40 and node 60 to effectively isolate the capacitance of node 60 from node 40, i.e., the input impedance of the buffer 62 is all that is seen at node 40 by the prior stages.

Figure 5:
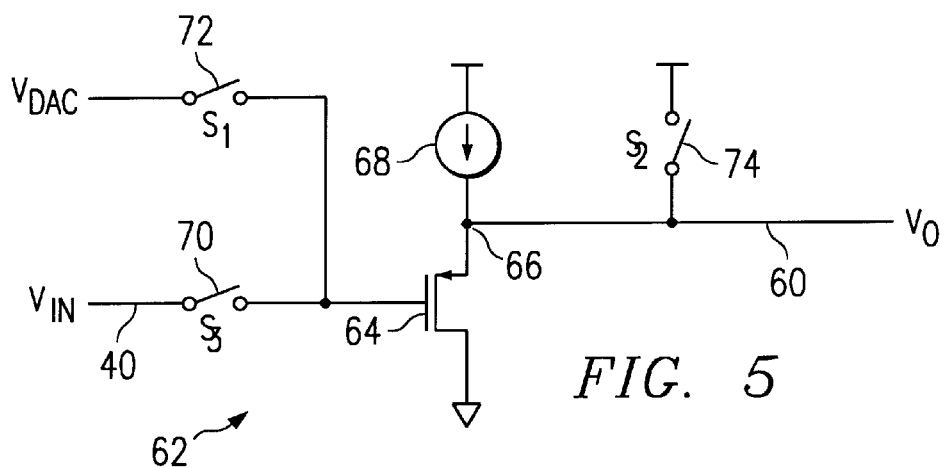
FIG. 5 illustrates a schematic diagram of the buffer circuit and two external switches.

Referring now to FIG. 5, there is illustrated a schematic diagram of the buffer 62 and two external switches 70 and 72. A P-channel transistor 64 is provided having the source/drain path thereof connected to a node 66 and ground or $V_{sa}$. A current source 68 is connected between node 66 and the positive supply $V_{dd}$. The node 66 and the source of transistor 64 are connected to the output node 60, $V_c$, and also to one side of a precharge switch 74. Switch 74 has the other side thereof connected to $V_{dd}$. The buffer 62 is operated in a switched capacitor environment and, therefore, the input of the buffer 62 at the gate of transistor 64 will be connected to one side of the switch 70, and the other side thereof connected to the $V_{in}$ line 40. The gate of transistor 64 in the input of the buffer 62 is also connected to one side of the switch 72, the other side thereof connected to a DAC voltage $V_{DAC}$, which provides predetermined reference voltages for predetermined operations during the data conversion operation, as is conventional and as will be described in more detail hereinbelow.

Figure 6:
FIG. 6 illustrates the timing diagram for the operation of the switches and of the buffer circuit of FIG. 5.
Figure 6:

Referring now to FIG. 6, there is illustrated a timing operation for the switch 70, labeled $S_3$, the switch 72, labeled $S_1$, and the switch 74, labeled $S_2$. The timing signal $S_3$ and the timing signal $S_1$ are basically the clock signals utilized for a switched capacitor operation that are referred to as $\phi_1$ and $\phi_2$, as will be described hereinbelow. In general, the clock signals $S_1$ and $S_3$ are non-overlapping clock signals, with signal $S_3$ occurring first and signal $S_2$ occurring second. Signal $S_2$ is an overlapping signal with both $S_3$ and $S_1$, which occurs for a very short period of time proximate to the beginning of $S_3$ or the beginning of $S_1$, there being illustrated two pulses for the timing signal $S_2$. The timing signal $S_2$ constitutes a precharge signal, as will be described hereinbelow.

It can be seen that, when switch $S_3$ closes, transistor 64 will be turned on when $V_{in}$ is more than one threshold below the voltage on node 66 and the current to node 66 through current source 68 will be essentially constant, as long as transistor 64 is turned on. Since switch 74 is closed initially, transistor 64 will be turned on at the beginning of the cycle such that the lower plates of the selected ones of the capacitors 46–50 will be initially pulled high for a very short duration of time in a precharge operation. After the switch 74 is opened, the node 66 is pulled down to a voltage that is one $V_t$ above the input voltage on the node 40 thereby allowing the input signal $V_{in}$ to be sampled onto the lower plates of the capacitors 46–50. When switch 72 is closed at a later time than switch 70, with switch 70 open, the voltage $V_{DAC}$ will be placed onto the gate of transistor 64. During the initial portion of the timing sequence $S_1$, the timing signal $S_2$ is present for a short duration of time to precharge the node 62 to $V_{dd}$ and, subsequently, the other side of the plate of capacitors 46–50.

Since transistor 64 can sink a reasonable amount of current, there is little problem with pulling the output low, or discharging the trimming capacitors 46–50 to the voltage $V_{in}+V_T$ on the source of transistor 64. When charging the plate(s) of trimming capacitor(s) from the source of the transistor 64, the only current path is the current source 68. This is not desirable, since the current source 68 is not a sufficiently large current path for charging. Rather, the switch 74 is provided to perform a precharge operation on the lower plate of the trimming capacitor(s) 46–50, such that the output is always pulled low from the precharge level when sampling. However, it can be seen that there is a resultant offset $V_T$ in the system. In a fully differential configuration, as will be described hereinbelow, the offset $V_T$ in the above-noted source follower configuration of FIG. 5 will be balanced on both sides and therefore canceled. Therefore, the output node 60 will be at a voltage $V_{in}+V_T$.

Figure 7:
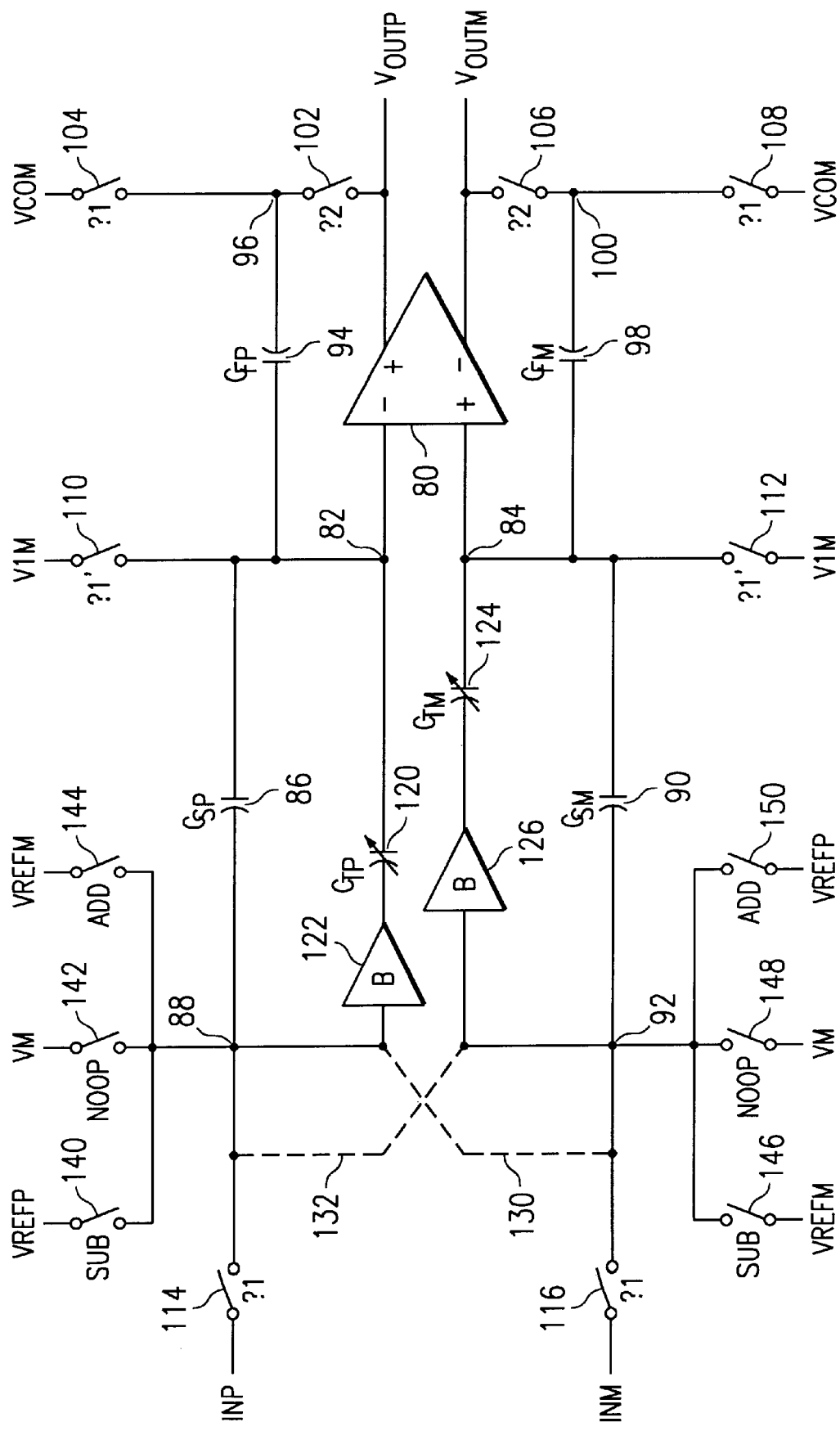
FIG. 7 illustrates a detailed schematic diagram of a differential amplifier operating in accordance with the present invention.

Referring now to FIG. 7, there is illustrated a fully differential schematic diagram of a gain stage utilizing the buffer 62. A differential amplifier 80 is provided having a positive and negative input and a positive and negative output. The negative input thereof is connected to a node 82 with the positive input thereof is connected to a node 84. A positive sampling capacitor 86, labeled $C_{sp}$, is connected between node 82 and a node 88. A negative sampling capacitor 90, labeled $C_{sm}$, is connected between node 84 and a node 92. A negative feedback capacitor 94, labeled $C_{Fp}$ is connected between node 82 and a node 96. A negative feedback capacitor 98, labeled $C_{FM}$, is connected between node 84 and a node 100.

Since this is a switched capacitor configuration, a plurality of switches are required in accordance with conventional switched capacitor operation. The node 96 is connected to the positive output of the amplifier 82 with a switch 102 connected to the clock signal $\phi_2$. Node 96 is also connected to a common voltage $V_{com}$ with a switch 104 controlled by the clock signal $\phi_1$. Node 100 is connected to the negative output of amplifier 80 with a switch 106, clocked by the signal $\phi_2$. Node 100 is also connected to the common voltage $V_{com}$ with a switch 108, clocked by signal $\phi_1$. Node 82 is connected to a mid-level voltage $V_{lm}$ through a switch 110, clocked by signal $\phi_1'$. Node 84 is connected to the mid-level voltage $V_{lm}$ through a switch 112, clocked by signal $\phi_1'$. Node 88 is connected to the positive input through a switch 114, clocked by $\phi_1$, and the negative input thereof is connected to node 92 through a switch 116, clocked by $\phi_1$.

The trimming operation of the sampling capacitors 86 and 90 is facilitated with two trimmable capacitor networks. Capacitor 86 is trimmed with a trimming capacitor network 120, labeled $C_{tp}$, which is connected between node 82 and the output of a first buffer 122. Similarly, the sampling capacitor 90 is trimmed with a trimming capacitor network 124, labeled $C_{tm}$. The trimming network 124 is connected between node 84 and the output of a second buffer 126. The input of buffer 122 and the input of buffer 126 are connected in two configurations to effectively increase or decrease the value of the sampling capacitors 86 and 90. In the primary configuration illustrated in FIG. 7, the input of buffer 122 is connected to node 88, and the input of buffer 126 is connected to node 92. This will effectively increase the capacitance value of the sampling capacitors 86 and 90. However, in the alternate configuration, the input of buffer 122 can be connected to node 92, as indicated by phantom line 130, and the input of buffer 126 can be connected to node 88, as indicated by a phantom line 132, to effectively decrease the capacitance value of the sampling capacitors 86 and 90. However, it should be noted that when the phantom lines 130 and 132 are utilized for the input connections, then buffer 122 is not connected on the input thereof to node 88, and buffer 126 is not connected on the input node thereof to node 92.

In the switched capacitor operation, the node 88 and the node 92 are connected to a different reference voltage levels, depending upon various operations. There are three operations: a subtract operation SUB, and addition operation ADD and a no-operation NOOP. In association with node 88, there are provided three switches 140, 142 and 144, each having one side thereof connected to node 88. The other side of switch 140 is connected to a reference voltage $V_{refp}$, a positive reference voltage, the switch 142 has the other side thereof connected to a mid-level voltage $V_m$, and the other side of switch 144 is connected to a reference voltage $V_{refm}$. The subtract operation is associated with switch 140, the addition operation is associated with the switch 144, and the no-operation is associated with switch 142. In a similar manner, there are provided three switches 146, 148 and 150 having one side thereof connected to node 92. The other side of switch 146 is connected to a negative reference voltage $V_{refm}$ and is controlled by the SUB operation. The switch 148 has the other side thereof connected to the mid-level voltage $V_m$ and is controlled by the NOOP operation. The other side of switch 150 is connected to the positive reference voltage $V_{refp}$ and is controlled by the ADD operation. The operation of the switches 146–150 will not be described herein, as they are associated with the normal switched capacitor operation.

Figure 8:
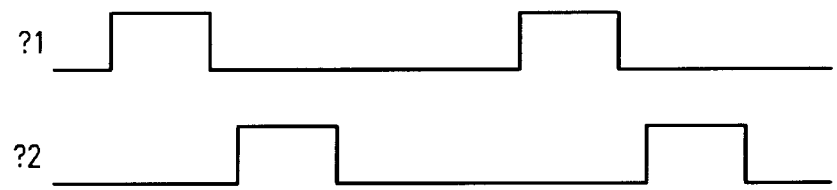
FIG. 8 illustrates a timing diagram for the switched capacitor operation.

Referring now to FIG. 8, there is illustrated the timing diagram for the clocks $\phi_1$ and $\phi_2$, this being a conventional operation.

Figure 9:
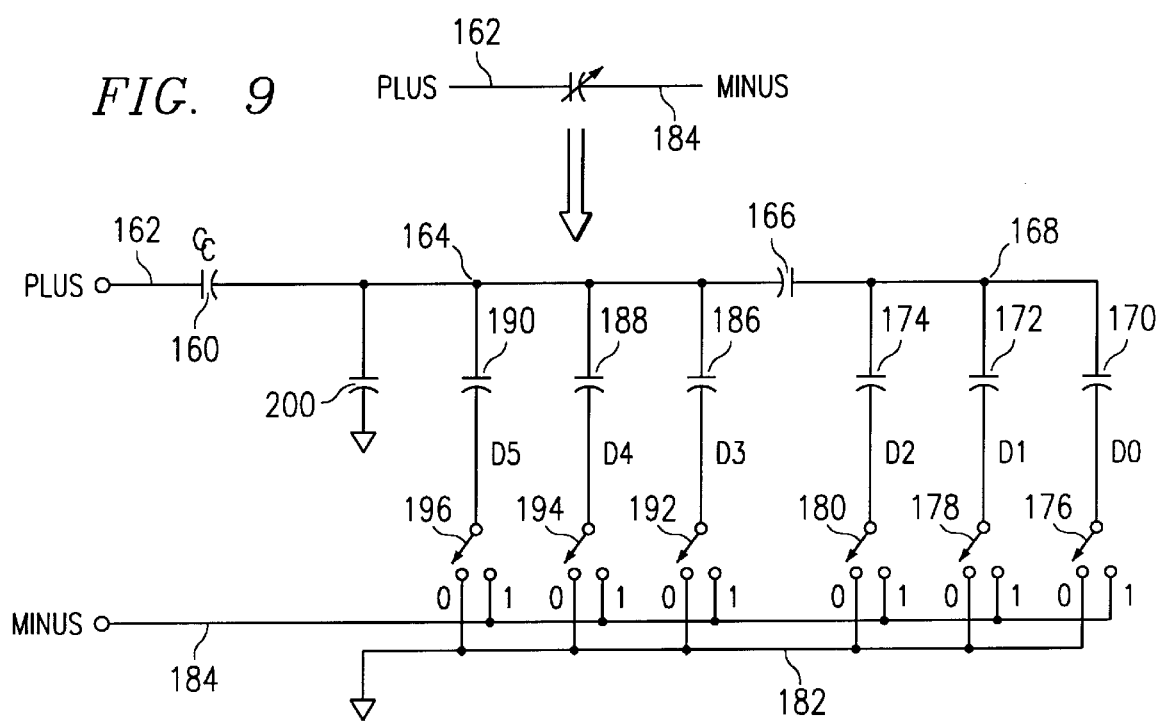
FIG. 9 illustrates a detailed schematic diagram of the trimmable capacitor network.

Referring now to FIG. 9, there is illustrated a circuit diagram for each of the trimming capacitor networks 120 and 124. The trimming networks 120 and 124 have associated therewith a coupling capacitor 160, which is connected between a positive node 162 and a node 164. Node 164 is connected to one side of a second coupling capacitor 166, the other side thereof connected to a node 168. Node 168 has three capacitors associated therewith, a capacitor 170, a capacitor 172 and a capacitor 174, each labeled D0, D1 and D2, respectively. Each of the capacitors 170–174 has one side thereof connected to node 168 and the other side thereof connected to one of respective switches 176, 178 and 180. Switches 176–180 have two positions, a first position associated with logic "0" which is connected to a ground node 182, and a second position for a logic "1" that is connected to a node 184, the node 184 comprising the negative plate of the trimming network. The logic "0" and the logic "1" are merely logic levels of a logic input device that controls the switches 176 and 180, this not being shown herein. However, it should be understood that these could be connected in a mask level configuration, they could be the result of a fusable link, or any other equivalent structure. It is merely an important aspect that the negative terminal of the capacitors 170–174 can be connected to one of the two positions.

The node 164 also has three capacitors associated therewith, a capacitor 186, a capacitor 188 and a capacitor 190, each of the capacitors 186–190 labeled D3, D4 and D5, respectively. Capacitors 186–190 each has the positive side thereof connected to node 164 and the negative side thereof connected to one of respective switches 192, 194 and 196. Switches 192–196 are connected to either the node 192 or the node 184, depending upon the respective logic state, logic "0" or logic "1," associated therewith. In addition to the capacitors 186–190, there is also a capacitor 200 connected between node 164 and ground. In the preferred embodiment, the capacitors 170, 172 and 174 have values of 40.5 fF, 81 fF and 162 fF, respectively. The capacitors D3, D4 and D5 have the values of 40.5 fF, 81 fF and 162 fF. The capacitor 166 has a value of 40.5 fF, and the capacitor 160 has a value of 8 fF. Capacitor 200 has a value of 338 fF.

In summary, there has been provided a method for incorporating a trimming circuit in an amplification stage associated with a pipeline analog-to-digital converter. The trimming circuit utilizes a coupling capacitor and a plurality of parallel capacitors disposed in a series therewith. The parallel capacitors can be connected in parallel with each other in any combination to vary the capacitance value of the overall coupling capacitor and parallel capacitor combination. This is disposed in parallel with a sampling capacitor associated with the amplification stage. This will vary the gain of that stage. This trimming network has associated with the input side thereof, or the side connected to the signal input, a buffer circuit for isolating the trimming network from the input.

Although the preferred embodiment has been described in detail, it should be understood that various changes, substitutions and alterations can be made therein without departing from the spirit and scope of the invention as defined by the appended claims.

What is claimed is:

1. An input gain stage for amplifying an input signal received on a signal input, comprising:

an amplifier having an input and an output;

an input capacitor having one plate thereof connected to the signal input and the other plate thereof connected to the input of said amplifier;

a feedback capacitor having one plate thereof connected to the input of said amplifier and the other plate thereof connected to the output of said amplifier;

a variable trimming capacitance network having a first side and a second side, with said first side connected to the input of said amplifier, said variable trimming capacitance network having a variable capacitance value; and a buffer connected between said signal input and said second side of said trimming capacitance network for isolating the input capacitance on said second side of said trimming capacitance network from said signal input and any preceding gain stages attached thereto;

the combination of said buffer and said trimming capacitance network defining a parallel capacitance which is disposed in parallel with said input capacitor such that the combination of said input capacitor, said trimming capacitance network and said buffer constituting an effective input capacitance, and wherein the ratio of said effective input capacitance to said feedback capacitor defines the gain of said amplifier.

2. The gain stage of claim 1 wherein said input capacitor comprises a sampling capacitor.

3. The gain stage of claim 1 wherein said variable trimming capacitance network comprises:

a first coupling capacitor having one side thereof connected to the input of said amplifier and the second side thereof connected to a first node; and a plurality of trim capacitors, each having one side thereof connected to said first node and the other side thereof connected to one side of one of a plurality of switches, each of said switches associated with one of said trimming capacitors, the other side of each of said switches connected to a second node, which said second node comprises the second side of said trimming capacitance network, said switches selectively actuated to dispose one or more of said trimming capacitors in parallel with each other between said first node and said second node.

4. The gain stage of claim 1 wherein each of said trimming capacitors is substantially larger than the value of said coupling capacitor.

5. The gain stage of claim 1 wherein said input capacitor, said feedback capacitor, said trimming capacitance network and said buffer are configured in a switched capacitor configuration.

6. The gain stage of claim 1 wherein said buffer comprises a source follower having a source follower transistor with the source/drain thereof connected between a first node and a ground reference node and the gate thereof connected to the signal input, the source thereof connected to a current source for sourcing current to the source of said source follower transistor with the source of said source follower transistor providing the output and wherein the output is one threshold voltage above the signal on the signal input.

7. The gain stage of claim 6, wherein said buffer and said source follower associated therewith are configured for a switched capacitor operation and further comprising:

a first switch for being connected between the signal input and the gate of said source follower transistor;

a second switch for being connected between the source of said source follower transistor and a reference voltage selected by a data conversion algorithm;

wherein said first switch is operable at a first time to store the voltage on the signal input onto the gate of said source follower transistor to pull the source thereof to a voltage one threshold above the input signal, and said second switch is operable at a second time different from the first time to pull the source thereof to a voltage one threshold above said reference voltage.

8. The gain stage of claim 7 wherein said first and second times are non-overlapping.

9. The gain stage of claim 7 and further comprising a precharge switch connected between the output of said source follower and a supply voltage level, wherein said precharge switch is operable during the initial time that said first switch is turned on to close and pull the output to the supply voltage level in a precharge operation, and during the initial time that said second switch is turned on to close and pull the output to the supply voltage level in a precharge operation.

10. The gain stage of claim 1 wherein said buffer has high input impedance.

11. A method for amplifying an input signal received on a signal input, comprising the steps of:

provided an amplifier having an input and an output;

connecting one plate of a capacitor to the signal input and the other plate of the input capacitor to the input of the amplifier;

disposing a feedback capacitor between the input of the amplifier and the output of the amplifier;

trimming the value of the input capacitor with a variable trimming capacitance network, having first and second sides with a variable capacitance value disposed therebetween and connecting one side of the variable capacitance network to one side of the input capacitor; and buffering the other side of the variable trimming capacitance network with a buffer such that the other side of the input capacitor network is buffered relative to the signal input;

the combination of the buffer and the trimming capacitance network defining a parallel capacitance which is disposed in parallel with the input capacitor such that the combination of the input capacitor, the trimming capacitance network and the buffer provide an effective input capacitance, and wherein the ratio of the effective input capacitance and the feedback capacitor defines the gain of the amplifier.

12. A method for amplifying an input signal received on a signal input, comprised of the steps of:

providing an amplifier having an input and an output with an input sampling capacitor disposed between the input of the amplifier and the signal input and a feedback capacitor disposed between the input of the amplifier and the output thereof;

disposing a trimming capacitance network in series with a buffer circuit, the series combination disposed in parallel with the input capacitor;

the combination of the buffer and the trimming capacitance network defining a parallel capacitance which is disposed in parallel with the input capacitor such that the combination of the input capacitor, the trimming capacitance network and the buffer constitute an effective input capacitance to the amplifier wherein the ration of the affected input capacitance and the feedback capacitor defines the gain of the amplifier.

* * * * *